United States Patent
Huang et al.

(10) Patent No.: US 8,498,168 B2
(45) Date of Patent: Jul. 30, 2013

(54) TEST METHOD FOR SCREENING LOCAL BIT-LINE DEFECTS IN A MEMORY ARRAY

(75) Inventors: Yin Chin Huang, Zhubei (TW); Chu Pang Huang, Hsinchu (TW); Yi Fang Chang, Pingjhen (TW); Cheng Chi Liu, New Taipei (TW); Chang Chan Yang, Zhubei (TW); Min Kuang Lee, Keelung (TW)

(73) Assignee: Macronix International Co., Ltd., Hsin-Chu (TW)

( * ) Notice: Subject to any disclaimer, the term of this patent is extended or adjusted under 35 U.S.C. 154(b) by 80 days.

(21) Appl. No.: 13/085,942

(22) Filed: Apr. 13, 2011

(65) Prior Publication Data

US 2012/0263002 A1    Oct. 18, 2012

(51) Int. Cl.
  *G11C 7/00*    (2006.01)
(52) U.S. Cl.
  USPC ............ 365/201; 365/200; 365/185.21

(58) Field of Classification Search
  USPC ........... 365/201, 200, 185.21, 185.18, 185.33
  See application file for complete search history.

(56) References Cited

U.S. PATENT DOCUMENTS

| | | | |
|---|---|---|---|
| 6,574,159 B2* | 6/2003 | Ohbayashi et al. | 365/201 |
| 8,274,853 B2* | 9/2012 | Lee | 365/201 |

\* cited by examiner

*Primary Examiner* — David Lam
(74) *Attorney, Agent, or Firm* — Alston & Bird LLP

(57) ABSTRACT

A method of detecting manufacturing defects at a memory array may include utilizing test circuitry to provide a selected voltage as drain bias on a bit-line of the memory array where the memory array is configured to employ a first voltage as the drain bias for a read operation and the selected voltage is higher than the first voltage, and determining whether a leakage current indicative of a manufacturing defect between the bit-line and another component of the memory array is present responsive to providing the selected voltage as the drain bias. A corresponding test device is also provided.

18 Claims, 10 Drawing Sheets

| Function | Control Gate (word line) | Drain (bit line) | Well | Source |
|---|---|---|---|---|
| Program | Positive High Voltage | Positive High Voltage | Ground | Ground |
| Erase | Negative High Voltage | Not Selected | Positive High Voltage | Not Selected |
| Read | Positive Voltage | ~1V | Ground | Ground |

FIG. 2.

| Function | Control Gate (word line) | Drain (bit line) | Well | Source |
|---|---|---|---|---|
| Program | Positive High Voltage | Positive High Voltage | Ground | Ground |
| Erase | Negative High Voltage | Not Selected | Positive High Voltage | Not Selected |
| Read | Positive Voltage | ~1V | Ground | Ground |
| Test | Positive Voltage | >1V | Ground | Ground |

FIG. 7.

| Condition | VA | VB | CA | CB | Drain |
|---|---|---|---|---|---|
| Normal | ~2V | Don't care | L | H | ~1V (normal bias) |
| Test | Don't Care | ~3 | H | L | ~2V (higher bias) |

TEST METHOD FOR SCREENING LOCAL BIT-LINE DEFECTS IN A MEMORY ARRAY

TECHNOLOGICAL FIELD

Embodiments of the present invention generally relate to semiconductor device manufacturing and, more particularly, relate to a process for screening manufacturing defects such as local bit-line defects in semiconductor devices such as memory arrays.

BACKGROUND

Since the advent of computers, there has been a steady drive toward producing smaller and more capable electronic devices, such as computing devices, communication devices and memory devices. In order to reduce the size of such devices, while maintaining or improving their respective capabilities, the size of components within the devices must be reduced. Several of the components within electronic devices are made from semiconductor materials, which in some cases are provided via a structure called a semiconductor wafer. Semiconductor wafers may be used to produce integrated circuits (ICs) having the performance and size characteristics desirable for a particular component.

Since modern ICs can be manufactured to such small scales, any defects on the ICs may have a relatively large impact on performance. If a defect is of a nature or size that is sufficient to damage semiconductor circuits or degrade the operating characteristics of such circuits, the corresponding semiconductor device's performance may be deteriorated. Defects, which may be produced during any of a plurality of manufacturing process steps, may cause shorts, opens or other anomalies that prevent normal operation of the semiconductor device. The impact caused by a particular defect is often directly related to the corresponding nature (e.g., size and/or location) of the defect. These defects must typically be recognized so that the defective components may be removed or repaired before they are provided to consumers.

Numerous testing processes have been developed to attempt to identify defects at various stages of the production process. However, many of the tests that are currently in use may be considered complex and/or costly. Accordingly, it may be desirable to provide an improved testing method.

BRIEF SUMMARY OF EXEMPLARY EMBODIMENTS

Embodiments of the present invention are therefore provided that may enable the provision of a test method for screening manufacturing defects such as local bit-line defects in semiconductor devices such as memory arrays. In some example embodiments, test circuitry may be applied to a memory array to selectably provide a higher voltage than the typical read voltage in order to induce a detectable leakage current in the presence of a defect of a given size. Thus, manufacturing defects may be detected relatively quickly and with lower cost.

In an example embodiment, a method of detecting defects at a memory array is provided. The method may include utilizing test circuitry to provide a selected voltage as drain bias on a bit-line of the memory array where the memory array is configured to employ a first voltage as the drain bias for a read operation and the selected voltage is higher than the first voltage, and determining whether a leakage current indicative of a manufacturing defect between the bit-line and another component of the memory array is present responsive to providing the selected voltage as the drain bias.

In another example embodiment, a test device for detecting defects at a memory array is provided. The test device may include a semiconductor device and test circuitry. The semiconductor device may include a memory array configured to employ a first voltage as the drain bias for a read operation. The test circuitry may be configured to interface with the memory array to provide a selected voltage as drain bias on a bit-line of the memory array. The selected voltage may be higher than the first voltage. The test circuitry may be configured to enable a determination to be made as to whether a leakage current indicative of a manufacturing defect between the bit-line and another component of the memory array is present responsive to providing the selected voltage as the drain bias.

It is to be understood that the foregoing general description and the following detailed description are exemplary, and are not intended to limit the scope of the invention.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 2 illustrates a chart of operating conditions that may be expected to be employed for the device of FIG. 1 when normal user functions are performed;

FIG. 7 illustrates a chart of operating conditions that may be expected to be employed for the device of FIG. 6 when normal user functions are performed and/or defect testing is performed according to an example embodiment;

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As indicated above, many memory devices (e.g., NOR and NAND flash memory devices) have tightly-spaced components. For example, many flash memory devices may have tight tolerances between the bit-lines in relation to metal-related processes. Such devices may also employ relatively high voltage operation in relation to providing access to memory cells. Any process defects located in the bit-lines of a flash memory array may cause the device to be non-conforming to product specifications. Thus, memory device manufacturers typically perform tests to detect potential defects by providing a high voltage to a group of bit-lines (e.g., even bit-lines) and provide a low voltage to another group of bit-lines (e.g., odd bit-lines) through the write (or program) drivers of the high voltage (HV) path. However, as indicated above, this kind of testing typically requires complex bit-line (or column) decoders, logic control circuitry, external tester resources and/or multiple pre-cycle test applications in order to detect defects. Thus, such testing can be costly.

Some example embodiments of the present invention may enable the determination of manufacturing defects such as local bit-line defects in semiconductor devices such as memory arrays in a manner that avoids some of the deficiencies described above. As an example, some example embodiments may enable the provision of a higher drain (bit-line) bias read as compared to normal read operations used in production flow. The higher drain bias may be used through sense amplifier circuitry to determine whether a leakage path exists between different bit-lines. Thus, for example, bit-line-to-bit-line defects may be screened out so that infant failure rates may be substantially reduced or even eliminated. Some example embodiments may also detect potential metal related defects between different bit-lines so that manufacturers can bin-out or repair defective devices before shipment and with much less circuitry being involved. Thus, some example embodiments may actually provide effective and more efficient screening methods as compared to a conventional pre-cycle test.

Figure 1:
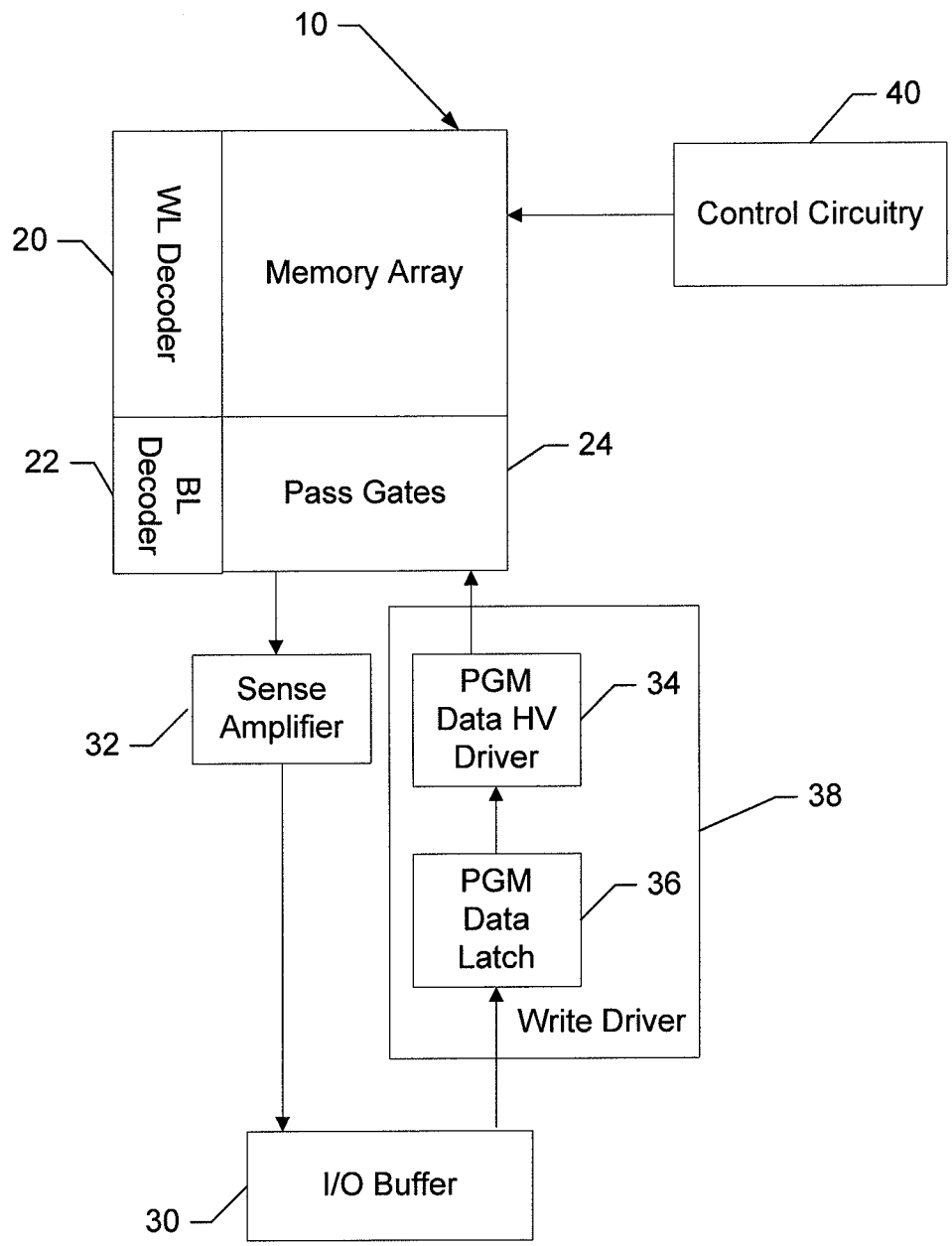
FIG. 1 illustrates a block diagram of an example NOR flash memory device.
Figure 3:
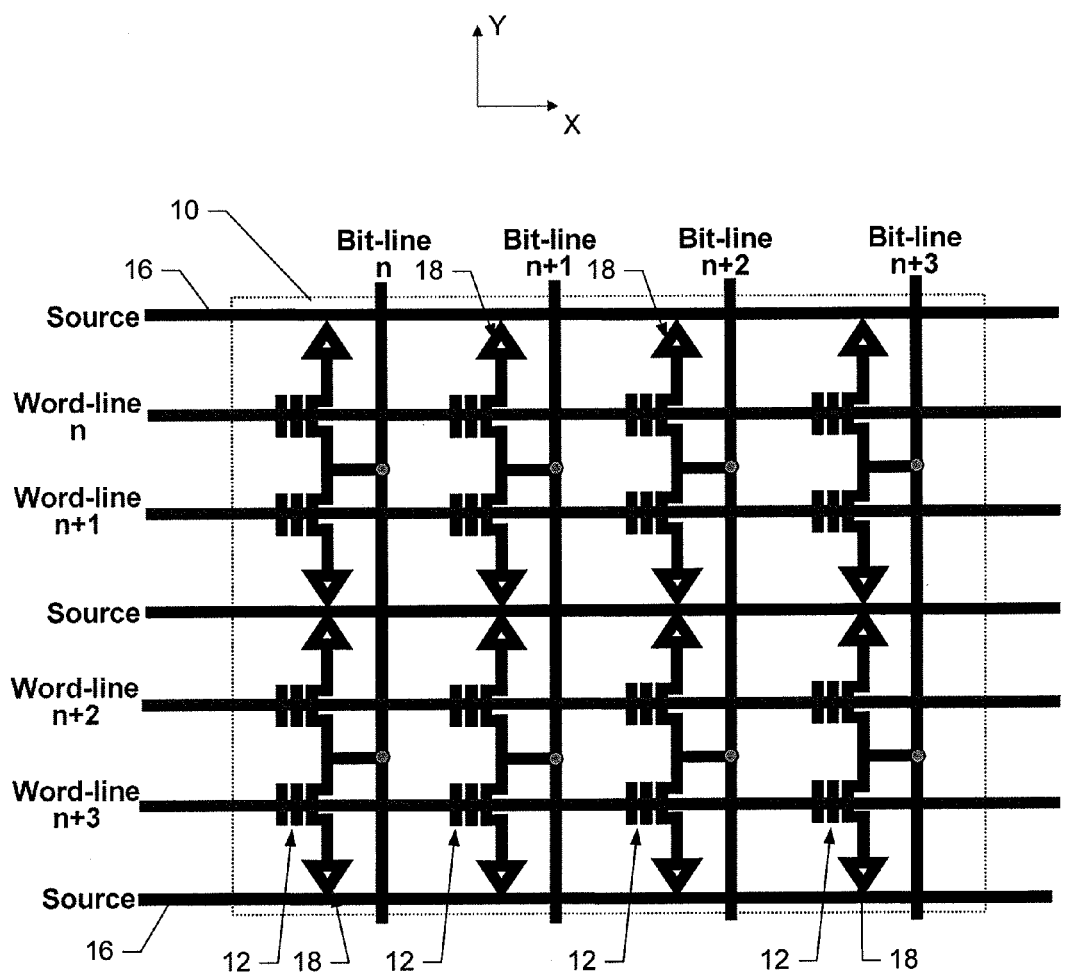
FIG. 3 illustrates a diagram of an example memory array of NOR flash cells from the device of FIG. 1.

FIG. 1 illustrates a block diagram of an example NOR flash memory device. FIG. 2 illustrates a chart of operating conditions that may be expected to be employed for the device of FIG. 1 when normal user functions are performed. FIG. 3 illustrates a diagram of an example memory array of NOR flash cells from the device of FIG. 1. In reference to FIGS. 1-3, a memory array 10 is provided. The memory array 10 may include a NOR flash memory or a NAND flash memory in some examples, and may include a plurality of memory cells 12 arranged in columns and rows. The rows of cells, which may extend in the X-direction, may be connected to a plurality of parallel conductive lines spaced apart from one another to form word-lines (e.g., word-line n, word-line n+1, word-line n+2, word-line n+3, etc.). The columns of cells, which may extend in the Y-direction, may also be connected to a plurality of parallel conductive lines spaced apart from each other to form bit-lines (e.g., bit-line n, bit-line n+1, bit-line n+2, bit-line n+3, etc.). The word-lines and bit-lines may be used in connection with one another in order to read data from and write data to particular cells and to erase cells when desired.

In an example embodiment, the memory array 10 may also include source lines 16 and a well (ground) 18. The memory array 10 may be in communication with a word-line decoder 20 that is enabled to perform word-line selection. The memory array 10 may also be in communication with a bit-line decoder 22 (e.g., via pass gates 24) for bit-line selection. In an example embodiment, an input/output (I/O) buffer 30 may be provided to communicate with the memory array 10 to receive indications of sensed data via sense amplifier 32, and to provide program data to the memory array 10 via a program (PGM) data latch 36 and a PGM data HV driver 34. The PGM data latch 36 and PGM data HV driver 34 may be implemented as portions of a write driver 38. Control circuitry 40 may also be provided for normal control with respect to user functions. In this regard, for example, the control circuitry 40 may be configured to provide conditions to induce certain user functions (e.g., program, erase and/or read operations).

In an example embodiment, various different control voltages may be applied to the memory array 10 during normal user operation to perform various functions such as program (or write) functions, erase functions, read functions or the like. FIG. 2 illustrates a table to map, for each of various user functions, the condition that may be maintained on the control gate (or word-lines), the drain (or bit-lines), the well 18 and the source lines 16 of the memory array 10. As an example, the drain bias during a read operation may be maintained at around 1 V to avoid read-disturb with respect to LVt cells due to soft hot electron programming while reading memory cells. In other words, the drain bias during a normal read may be set to keep the LVt cell without a significant Vt shift.

Figure 4:
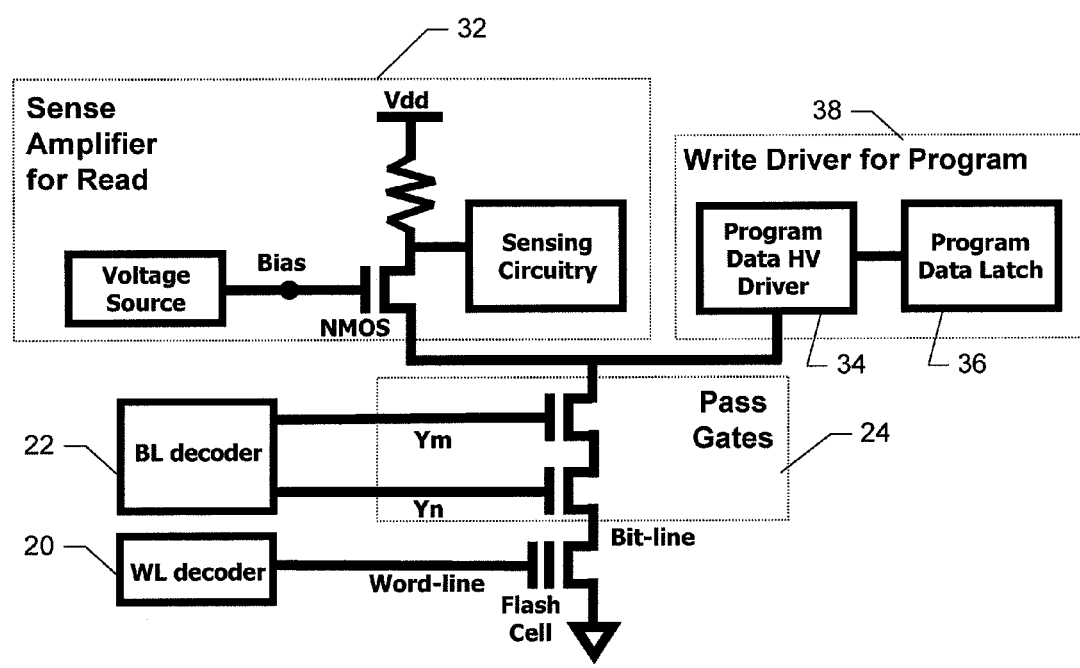
FIG. 4 illustrates a more detailed view of some of the structural elements of the memory array of FIG. 1.

FIG. 4 illustrates a more detailed view of some of the structural elements of the memory array 10 of FIG. 1 in which the bit-lines of the memory array 10 are selectively, electronically connected to the write driver 38 or the sense amplifier 32 through the pass gates 24. Thus, for example, the drain bias of a flash cell at the bit-line can be selectively adjusted by providing a high voltage through the write driver 38 during program operation, or by providing about 1 V bias to read out the contents of the memory array 10 via the sense amplifier 32 during a read operation.

Figure 5:
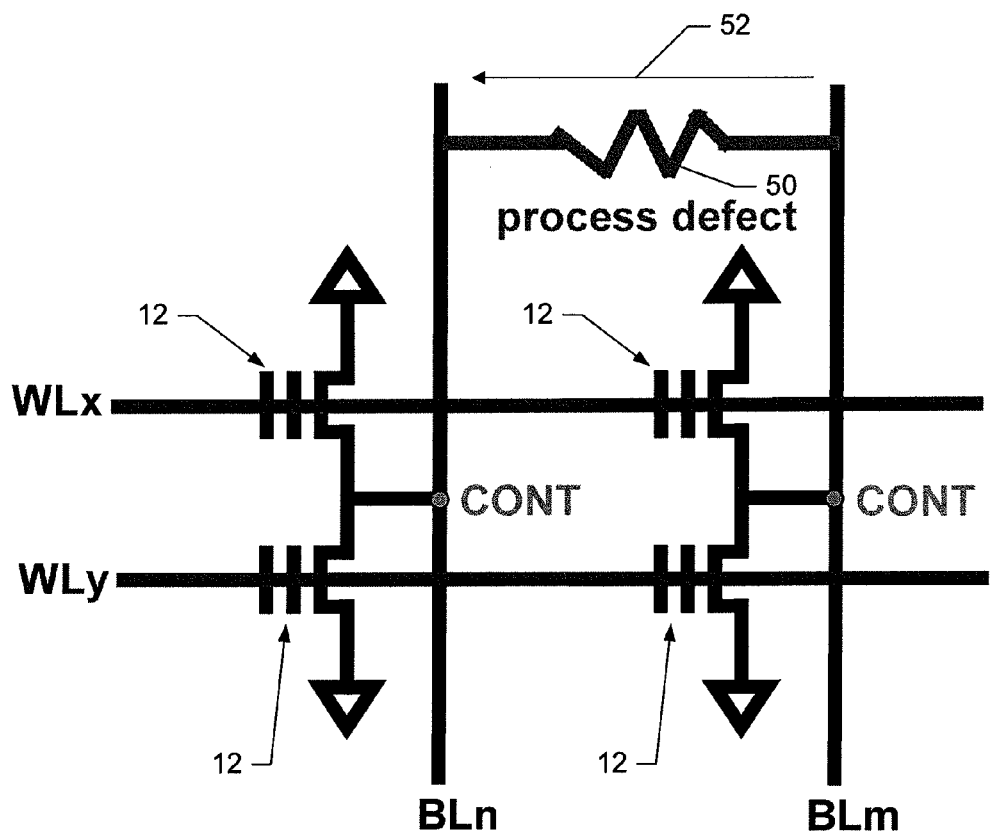
FIG. 5 illustrates an example of a process defect that may be located between bit lines of a memory array according to an example embodiment.

FIG. 5 illustrates an example of a process defect that may be located between bit lines of a memory array. As is shown in FIG. 5, word-lines (e.g., WLx and WLy) may be provided along with bit-lines (e.g., BLn and BLm) as part of the memory array 10. A processing defect 50 between bit-lines may be represented schematically as a flow path (shown by arrow 52) between the bit-lines (BLn and BLm). Example embodiments of the present invention may employ a different test method than that described above in connection with FIGS. 1-4.

Figure 6:
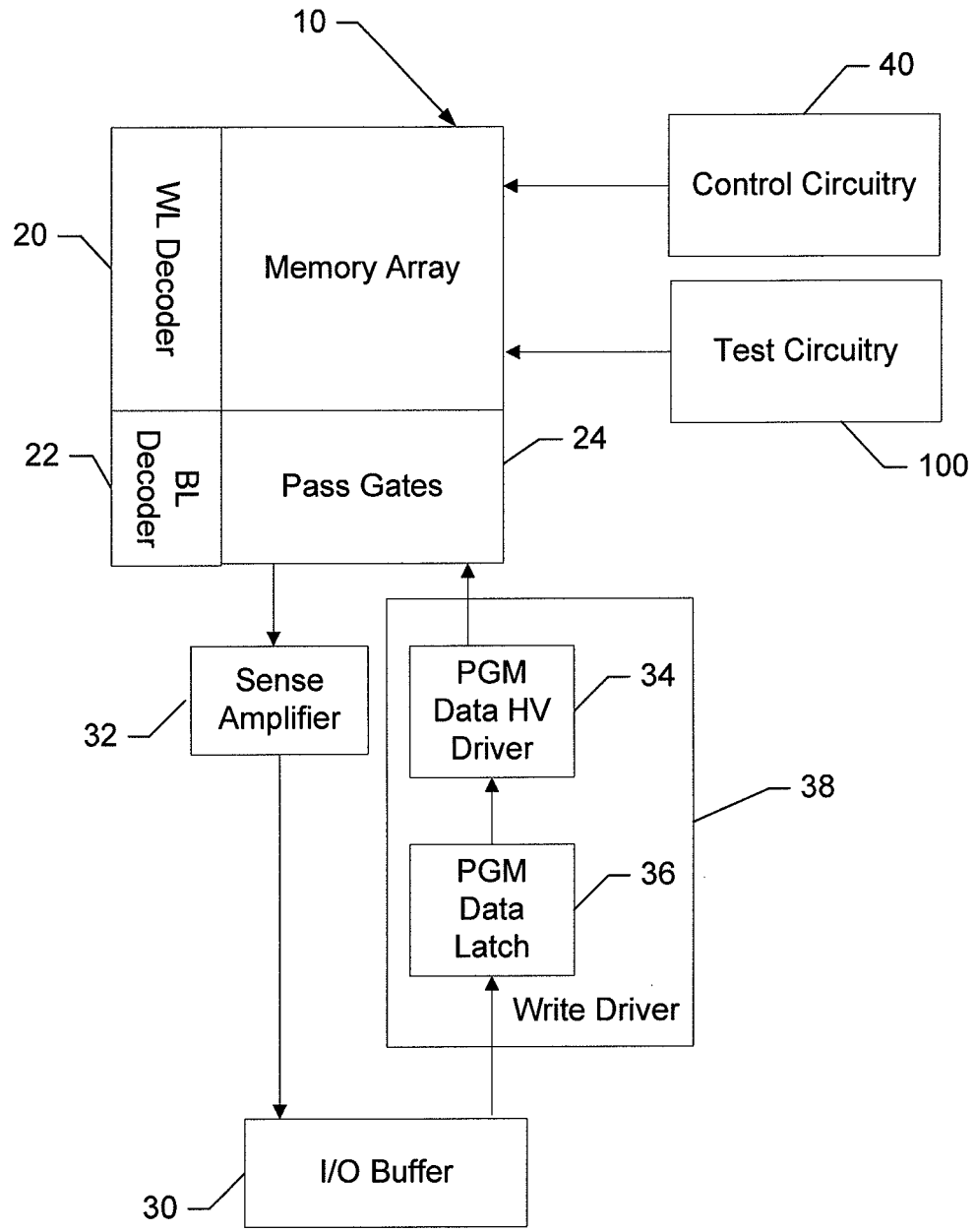
FIG. 6 illustrates a block diagram of a memory array employing a test method involving test circuitry according to an example embodiment.

FIG. 6 illustrates a block diagram of the memory array 10 employing a test method involving test circuitry 100 according to an example embodiment of the present invention. The memory array 10 and the other components associated therewith may be similar in form and function to those described above in connection with the description of FIG. 1. As such, the corresponding components of FIG. 6 are numbered the same as in FIG. 1 and will not be described in detail here. However, the inclusion of the test circuitry may enable the application of a higher drain bias than that which was used in connection with the example shown in FIGS. 1-4 during read operations. FIG. 7 illustrates a chart similar to the chart of FIG. 2, except that FIG. 7 accounts for an additional test function and illustrates the corresponding conditions associated therewith. As such, FIG. 7 illustrates a chart of operating conditions expected to be employed for the device of FIG. 6 when normal user functions are performed and/or defect testing is performed according to an example embodiment.

Figures 8, 9:
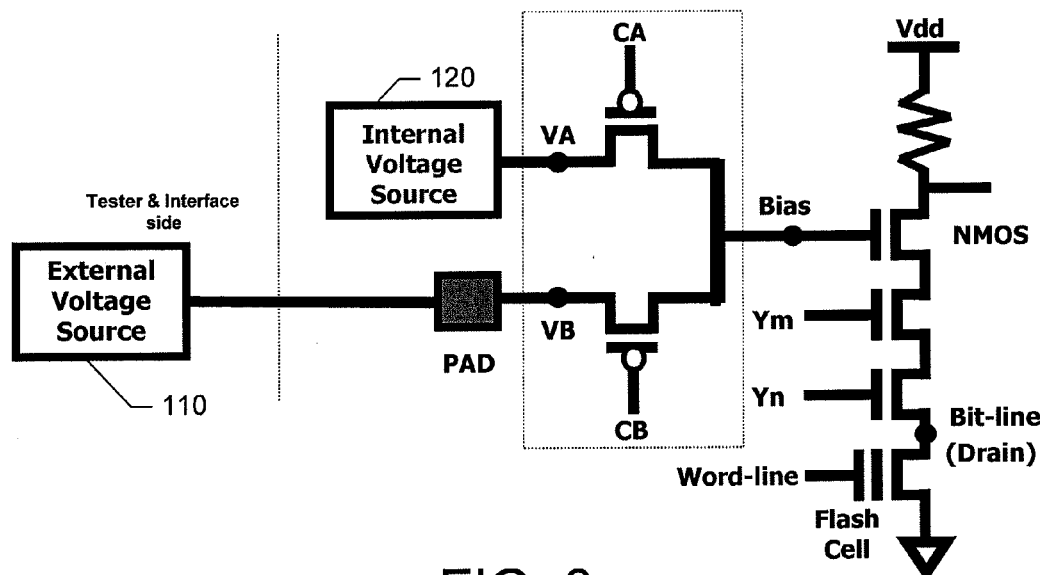
FIG. 8 illustrates how a higher drain bias may be applied during a test operation that is similar to a read operation but using greater than the 1 volt (V) bias used during the read operation, according to an example embodiment.
FIG. 9 shows a chart of voltages applied at various locations for the normal and testing conditions as may be applied to FIG. 8 according to an example embodiment.

As shown in FIG. 7, similar conditions are created to those that are present for reading of a memory cell except that a higher drain voltage may be applied (e.g., greater than 1 V) on the bit-line or drain side of the memory cell 10. FIG. 8 illustrates how the higher drain bias may be applied during a test operation that is similar to a read operation but using greater than the 1 V bias used during the read operation. In this regard, the test circuitry 100 may include an external voltage source 110 that may be connected to the memory array 10 via a PAD to a node VB. In this example, the external voltage source 110 may provide a voltage of about 3 V to node VB during test conditions. An internal voltage source 120 may also be provided to supply about 2 V to node VA. The voltage at node VA or at node VB may be selectably provided as bias for the drain side (or bit-line) of the memory array 10 based on values provided at node CA and CB, respectively. Nodes CA and CB may be set either high or low based on operation of the test circuitry 100. During normal operation, CA may be held low and CB may be high in order to pass the voltage at node VA along and effectively block the voltage at node VB from being passed along. This configuration may provide a drain bias of about 1 V for read operation as described above.

In situations in which testing is conducted, CA may be high while CB is held low in order to pass the voltage at node VB along to provide bias for the drain side of the memory array 10. In this configuration, greater than 1 V may be applied as the drain bias. FIG. 9 shows a chart of voltages that may be applied at various locations for the normal and testing conditions as they apply to FIG. 8. As can be seen from FIG. 9, when in the normal condition, the value of voltage at node VB does not matter since it will be blocked. Similarly, in the test condition, the value at node VA does not matter since it will be blocked.

Referring again to FIG. 5 in relation to the description above for FIGS. 8 and 9, consider an instance in which normal conditions are set, the drain bias is set to about 1 V for a particular bit-line (e.g., BLm from FIG. 5) and the other bit-lines (e.g., BLn) are held to 0V or ground, and the word-lines (e.g., WLx and WLy) are also grounded. In such an instance, if there is a defect, the current through the leakage flow path 52 through a process defect 50 of 140K ohms may be about 7 micro amps. Meanwhile, if the drain bias is set to a value greater than 1 V, such as 2 V, for the same process defect, the current through the leakage flow path 52 may be about 14 micro amps. Thus, for example, in the test condition, a determination may be made as to whether there is leakage current detectable through the leakage flow path 52 that is about a threshold. In an example embodiment, the threshold may be 10 micro amps (i.e., a 10 micro amp judging current). Thus, in the above example, with about 1 V drain bias, no defect may be detected; but if test conditions are set with greater than 1 V (e.g., 2 V) drain bias, the threshold may be exceeded and the defect may be detected as a leakage current in an adjacent bit-line.

Figure 10:
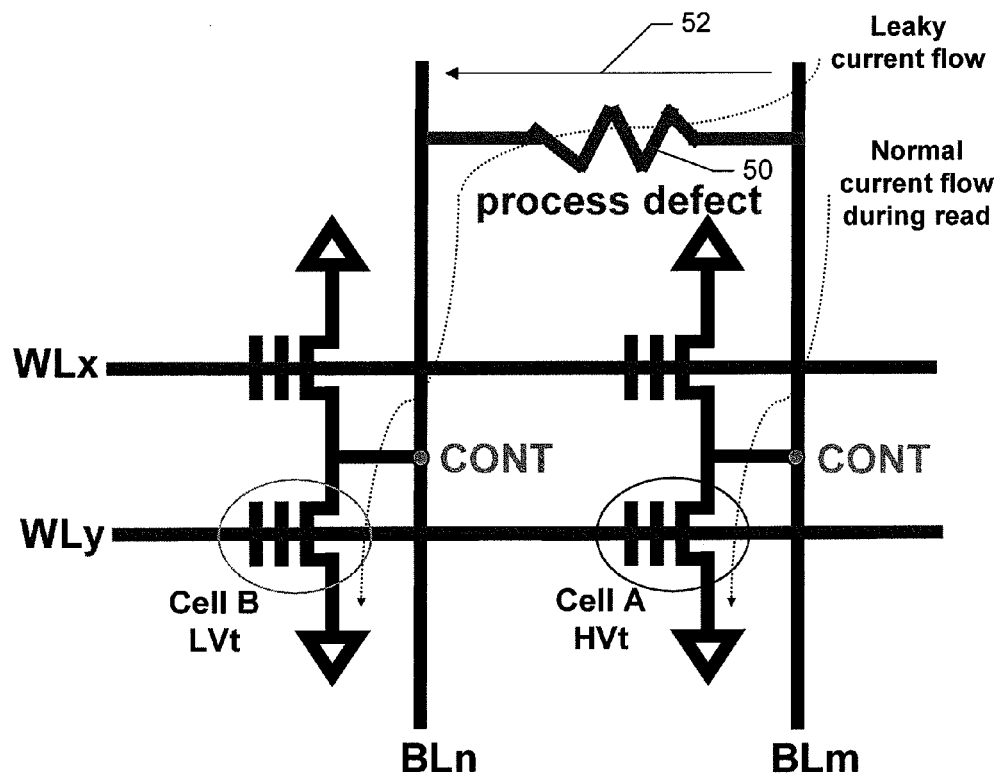
FIG. 10 illustrates another example for screening manufacturing defects according to an example embodiment.
Figure 11:
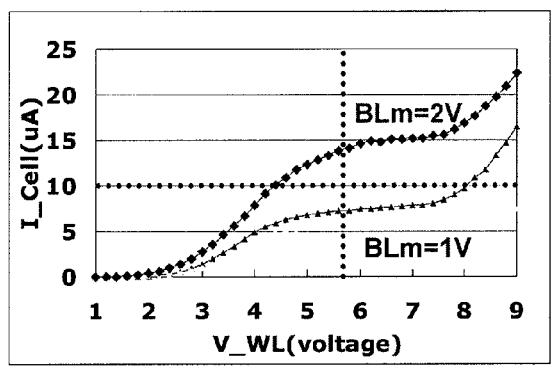
FIG. 11 illustrates a graph of cell current that may be detected versus word-line voltage values for different bit-line voltages (e.g., 2 V versus 1 V) according to an example embodiment.

FIG. 10 illustrates another example for screening manufacturing defects according to an example embodiment. According to the example shown in FIG. 10, Cell A may be an HVt cell (e.g., having a value of about 8V), while cell B is an LVt cell (e.g., having a value of about 4V). BLm may be set to about 1 V for normal read operation or to greater than 1 V (e.g., 2 V) for test operation. With BLn floating and WLx set to ground, the level of WLy may be set to a level between LVt cell and HVt cell levels (e.g., 5.8V). Using a judging current of 10 micro amps, cell A may be read to determine the current relative to the judging current. FIG. 11 illustrates a graph of cell current that may be detected versus word-line voltage values for different bit-line voltages (e.g., 2 V versus 1 V). If there is a process defect and the leakage flow path 52 exists, when reading cell A of HVt, while cell A is an HVt cell and cell B is an LVt cell, both the leakage current and the current of cell A can be seen and the defect may be detected. As can be seen from FIG. 11, for this example, the 10 micro amp judging current value may fall nearly midway between the measured cell currents. Thus, for this example, using 2 V as an example of a bit-line voltage that is greater than 1 V for the test condition may provide a relatively easily distinguishable leakage current that can be measured to indicate the presence of a fault associated with a process defect.

As can be seen from the above example, some example embodiments of the present invention may be used to detect process defects in memory arrays. However, it should be appreciated that the processes described above may be useful for detecting many different types of defects. For example, some embodiments may be employed for effectively detecting bit-line to well leakage, bit-line to source-line leakage, global bit-line to global bit-line leakage, global bit-line to source-line leakage, bit-line to word-line leakage when some manufacturing defect causes the corresponding leakage, or the like. Example embodiments may be applied to various articles of manufacture by selection of a suitable level of higher voltage to apply in order to detect drain leakage easily by increasing the leakage level to more detectable levels by creating a larger voltage difference than that which occurs during normal operation. Moreover, although an external power source was described above, it may also be possible to selectably apply a higher drain bias than that which is used for read operations using an internal power source in some example embodiments.

Example embodiments may provide for screening out defects by reading one word-line of an individual sector (or block) to detect errors over the whole bit-line to bit-line defect range within the corresponding sector. Accordingly, testing time may be reduced. Example embodiments may therefore introduce a way to apply an adjustable higher bias (e.g., via selectable operation of the test circuitry 100 to apply desirable bias voltages to the drain (or bit-line) than that which is applied when reading a cell. By selectably applying the higher drain bias voltage, a larger voltage difference may be induced over a process defect in the case of a leakage flow path existing. Thus, a larger and more easily detectable leakage current may be provided to enhance process defect detection capabilities in relation to memory array devices such as NOR and NAND flash memories. Infant failure rates can therefore be reduced at a lower testing cost.

Figure 12:
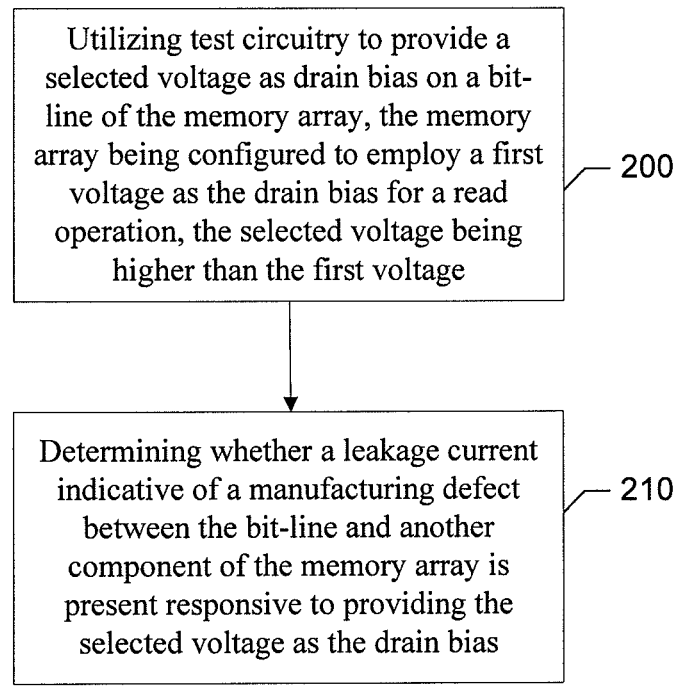
FIG. 12 is a block diagram describing a method for providing a test procedure for detection of manufacturing defects at a memory array according to an example embodiment of the present invention.

FIG. 12 is a flowchart illustrating operations associated with an example method of providing a test pattern for detection of manufacturing defects at a memory array according to an example embodiment. It should be understood that each block of the flowchart, and combinations of blocks in the flowchart, can be implemented by various mechanisms, such as under the control of an operator or via hardware, alone or under direction of firmware and/or software including one or more computer program instructions. For example, one or more of the procedures described herein may be embodied by computer program instructions. In this regard, the computer program instructions which embody the procedures described above may be stored by a memory and executed by a processor. As will be appreciated, any such computer program instructions may be loaded onto a computer or other programmable apparatus (i.e., hardware) to produce a machine, such that the instructions which execute on the computer or other programmable apparatus create means for implementing the functions specified in the flowchart block(s). These computer program instructions may also be stored in a computer-readable electronic storage memory that can direct a computer or other programmable apparatus to function in a particular manner, such that the instructions stored in the computer-readable memory produce an article of manufacture including instruction means which implement the function specified in the flowchart block(s). The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart block(s).

Accordingly, blocks of the flowchart support combinations of means for performing the specified functions, combinations of operations for performing the specified functions and program instruction means for performing the specified functions. It will also be understood that one or more blocks of the flowchart, and combinations of blocks in the flowchart, can be implemented by special purpose hardware-based computer systems which perform the specified functions or operations, or combinations of special purpose hardware and computer instructions.

As shown in FIG. 12, a method for providing a test process for detection of manufacturing defects at a memory array according to one example may include utilizing test circuitry to provide a selected voltage as drain bias on a bit-line of the memory array in which the memory array is configured to employ a first voltage as the drain bias for a read operation and the selected voltage is higher than the first voltage at operation 200, and determining whether a leakage current indicative of a manufacturing defect between the bit-line and another component of the memory array is present responsive to providing the selected voltage as the drain bias at operation 210.

In some embodiments, the operations above may be modified or amplified as described below. Moreover, in some cases, further operations may be conducted in addition to those discussed above. Some or all of the modifications, amplifications and/or additional operations may be combined in some embodiments in any order and in every possible combination. For example, in some cases, determining whether the leakage current is present may include determining whether the leakage current is detectable between the bit-line and another bit-line, between the bit-line and a word-line, between the bit-line and a well of the memory array, between the bit-line and a source-line. In some embodiments, utilizing test circuitry to provide the selected voltage may include applying the selected voltage when the test circuitry is switched to provide the selected voltage instead of the first voltage. In an example embodiment, determining whether the leakage current is present may include determining whether a current is detected that is greater than a threshold. In some cases, utilizing test circuitry to provide the selected voltage may include applying a second voltage value as the selected voltage. The second voltage value may have a value greater than a minimum value necessary to provide the leakage current at a minimum current level defined for detecting a fault in the memory array of a given resistance value. In an example embodiment, the first voltage is about 1 V and the second voltage is about 2 V.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for detection of a manufacturing defect in a memory array comprising:
   utilizing test circuitry to provide a selected voltage as a drain bias on a bit-line of the memory array, the memory array being configured to employ a first voltage as the drain bias for a read operation, the selected voltage being higher than the first voltage; and
   determining whether a leakage current is present responsive to providing the selected voltage as the drain bias, the leakage current being indicative of a manufacturing defect between the bit-line and another component of the memory array.

2. The method of claim 1, wherein determining whether the leakage current is present comprises determining whether the leakage current is detectable between the bit-line and another bit-line.

3. The method of claim 1, wherein determining whether the leakage current is present comprises determining whether the leakage current is detectable between the bit-line and a word-line.

4. The method of claim 1, wherein determining whether the leakage current is present comprises determining whether the leakage current is detectable between the bit-line and a well of the memory array.

5. The method of claim 1, wherein determining whether the leakage current is present comprises determining whether the leakage current is detectable between the bit-line and a source-line.

6. The method of claim 1, wherein utilizing test circuitry to provide the selected voltage comprises applying the selected voltage when the test circuitry is switched to provide the selected voltage instead of the first voltage.

7. The method of claim 1, wherein determining whether the leakage current is present comprises determining whether a current is detected that is greater than a threshold.

8. The method of claim 7, wherein utilizing test circuitry to provide the selected voltage comprises applying a second voltage value as the selected voltage, the second voltage value having a value greater than a minimum value necessary to provide the leakage current at a minimum current level defined for detecting a fault in the memory array of a given resistance value.

9. The method of claim 8, wherein the first voltage is about 1 V and the second voltage is about 2 V.

10. A test device for detection of a manufacturing defect at a memory array comprising:
    a semiconductor device including the memory array configured to employ a first voltage as drain bias for a read operation; and
    test circuitry configured to interface with the memory array to provide a selected voltage as the drain bias on a bit-line of the memory array, the selected voltage being higher than the first voltage, the test circuitry configured to enable a determination to be made as to whether a leakage current indicative of a manufacturing defect between the bit-line and another component of the memory array is present responsive to providing the selected voltage as the drain bias.

11. The test device of claim 10, wherein the other component is another bit-line.

12. The test device of claim 10, wherein the other component is a word-line.

13. The test device of claim 10, wherein the other component is a well of the memory array.

14. The test device of claim 10, wherein the other component is a source-line.

15. The test device of claim 10, wherein the test circuitry is configured to provide the selected voltage by applying the selected voltage when the test circuitry is switched to provide the selected voltage instead of the first voltage.

16. The test device of claim 10, wherein the test circuitry is configured to determine whether the leakage current is present by determining whether a current is detected that is greater than a threshold.

17. The test device of claim 16, wherein the test circuitry is configured to provide the selected voltage by applying a second voltage value as the selected voltage, the second voltage value having a value greater than a minimum value necessary to provide the leakage current at a minimum current level defined for detecting a fault in the memory array of a given resistance value.

18. The test device of claim 17, wherein the first voltage is about 1 V and the second voltage is about 2 V.

* * * * *